US008722143B2

(12) United States Patent
Werner et al.

(10) Patent No.: US 8,722,143 B2
(45) Date of Patent: May 13, 2014

(54) METHOD TO PREPARE SUPERHYDROPHOBIC SURFACES ON SOLID BODIES BY RAPID EXPANSION SOLUTIONS

(75) Inventors: Oskar Peter Werner, Kungsängen (SE); Lars-Erik Rudolf Wagberg, Lidingö (SE); Can Quan, Beijing (CN); Charlotta Kristina Turner, Uppsala (SE); Jan-Christer Eriksson, Djursholm (SE)

(73) Assignee: Cellutech AB, Stockholm (SE)

( * ) Notice: Subject to any disclaimer, the term of this patent is extended or adjusted under 35 U.S.C. 154(b) by 703 days.

(21) Appl. No.: 12/667,033

(22) PCT Filed: Jun. 30, 2008

(86) PCT No.: PCT/SE2008/050801
§ 371 (c)(1),
(2), (4) Date: Nov. 22, 2010

(87) PCT Pub. No.: WO2009/005465
PCT Pub. Date: Jan. 8, 2009

(65) Prior Publication Data

US 2011/0059307 A1 Mar. 10, 2011

Related U.S. Application Data

(60) Provisional application No. 61/022,563, filed on Jan. 22, 2008, provisional application No. 60/937,796, filed on Jun. 29, 2007.

(51) Int. Cl.
*C23C 16/00* (2006.01)

(52) U.S. Cl.
USPC ...................... 427/248.1; 427/421.1; 427/424

(58) Field of Classification Search
USPC ........................................................ 427/421.1
See application file for complete search history.

(56) References Cited

U.S. PATENT DOCUMENTS 4,882,107 A * 11/1989 Cavender et al. ............... 264/51

(Continued)

FOREIGN PATENT DOCUMENTS

EP 0370268 A2 5/1990

(Continued)

OTHER PUBLICATIONS

Office Action received for Chinese Patent Application No. 200880101207.0, mailed on Nov. 23, 2012, 19 pages (11 pages of English Translation and 8 pages of Office Action).

(Continued)

*Primary Examiner* — Timothy Meeks
*Assistant Examiner* — Nathan T Leong
(74) *Attorney, Agent, or Firm* — Morrison & Foerster LLP

(57) ABSTRACT

The present invention refers to a method for preparing a superhydrophobic surface on a solid substrate comprising the steps of (a) providing a solvent in the form of a pressurized fluid in a vessel, wherein the fluid exhibits a decrease in solvency power with decreasing pressure; (b) adding a hydrophobic substance to the solvent as a solute, which substance is soluble with the pressurized fluid and has the ability to crystallize/precipitate after expansion of the fluid, thereby obtaining a solution of the solvent and the solute in the vessel; (c) having at least one orifice opened on the vessel, thereby causing the pressurized solution to flow out of the vessel and depressurize in ambient air or in an expansion chamber having a lower pressure than within the vessel, the solute thereby forming particles; and (d) depositing the particles on the substrate in order to obtain a superhydrophobic surface. Hereby, a pressurized fluid which expands rapidly as a result of depressurization is used to prepare the superhydrophobic surface, thereby facilitating the preparation of the surface. Moreover, the invention refers to an arrangement for preparing a superhydrophobic surface on a substrate, a superhydrophobic film prepared by the method of the invention, and a substrate having deposited thereon the superhydrophobic firm.

15 Claims, 12 Drawing Sheets

(56) References Cited

U.S. PATENT DOCUMENTS

| | | | |
|---|---|---|---|
| 2002/0150726 | A1 | 10/2002 | Nun et al. |
| 2002/0192380 | A1 | 12/2002 | Elsbernd et al. |
| 2005/0053782 | A1 | 3/2005 | Sen et al. |
| 2005/0118433 | A1 | 6/2005 | Oles et al. |
| 2005/0136217 | A1 | 6/2005 | Barthlott et al. |

FOREIGN PATENT DOCUMENTS

| | | | |
|---|---|---|---|
| FR | 2893266 | A1 | 5/2007 |
| JP | 61-500210 | A | 2/1986 |
| JP | 2-212107 | A | 8/1990 |
| JP | 3-504878 | A | 10/1991 |
| JP | 5-68936 | A | 3/1993 |
| JP | 5-345985 | A | 12/1993 |
| JP | 8-131941 | A | 5/1996 |
| JP | 2002-97013 | A | 4/2002 |
| JP | 2002-529230 | A | 9/2002 |
| JP | 2002-532244 | A | 10/2002 |
| JP | 2003-501245 | A | 1/2003 |
| JP | 2006-515705 | A | 6/2006 |
| JP | 2007-144916 | A | 6/2007 |
| WO | 85/00993 | A1 | 3/1985 |
| WO | 90/11333 | A1 | 10/1990 |
| WO | 99/19080 | A1 | 4/1999 |
| WO | WO-99/19081 | A1 | 4/1999 |
| WO | 03/101624 | A1 | 12/2003 |
| WO | 2005/092487 | A1 | 10/2005 |
| WO | 2006/109583 | A1 | 10/2006 |

OTHER PUBLICATIONS

Office Action received for Canadian Patent Application No. 2,692,946, mailed on Jan. 30, 2013, 4 pages.

International Preliminary Report on Patentability and Written Opinion received for PCT Patent Application No. PCT/SE2008/050801, mailed on Jan. 14, 2010, 7 pages.

Office Action received for Japanese Patent Application No. 2010-514700, mailed on Jan. 10, 2012, 10 pages (6 pages of English Translation and 4 pages of Office Action).

Office Action received for Chinese Patent Application No. 200880101207.0 issued on Feb. 28, 2012, 15 Pages (9 pages of English translation and 6 pages of Office Action).

Yoshida et al., "Superhydrophobic Surfaces of Microspheres Obtained by Self-Assembly of poly[2-(perfluorooctyl) ethyl Acrylate-ran-2-(Dimethylamino)ethyl Acrylate] in Supercritical Carbon Dioxide", Colloid Polymer Science, vol. 285, 2007, pp. 1293-1297.

Cassie, A.B.D. and Baxter, S. (1944). "Wettability of porous surfaces," *Transactions of the Faraday Society* 40:546-551.

Gunnars, S. at al. (2002). "Model films of cellulose: I. Method development and initial results," *Cellulose* 9:239-249.

International Search Report and Written Opinion mailed Oct. 28, 2008, for PCT Application No. PCT/SE2008/050801 filed Jun. 30, 2008, 11 pages.

Onda, T. et al. (1996). "Super-water-repellent fractal surfaces," *Langmuir* 12(9):2125-2127.

Wenzel, R.N. (1936). "Resistance of solid surfaces to wetting by water," *Industrial and Engineering Chemistry* 28:988-994.

Ye, X.R. (Feb. 2003). "Making nanomaterials in supercritical fluids: A review," *Journal of Chemical Education* 80(2):198-204.

Extended European Search Report received for European Patent Application No. 08767267.1, mailed on Nov. 25, 2011, 7 pages.

* cited by examiner

O 1s:2(080128_MN_prov2_AKD)

Lens Mode:Hybrid Resolution:Pass energy 20 Iris(Aperture):slot(Slot)
Anode:Mono(Al (Mono))(150 W) Step(meV): 100.0 Dwell(ms): 331 Sweeps: 15 Acqn. Time(s): 905
Acquired On 08/01/28 11:35:28 C/N :On O 1s:2(080128_MN_prov3_Paper_Treated)

Lens Mode:Hybrid Resolution:Pass energy 20 Iris(Aperture):slot(Slot)
Anode:Mono(Al (Mono))(150 W) Step(meV): 100.0 Dwell(ms): 331 Sweeps: 7 Acqn. Time(s): 422
Acquired On :08/01/28 10:33:57 C/N :On C 1s:3(080128_MN_prov3_Paper_Treated)

Lens Mode:Hybrid Resolution:Pass energy 20 Iris(Aperture):slot(Slot)
Anode:Mono(Al (Mono))(150 W) Step(meV): 100.0 Dwell(ms): 260 Sweeps: 4 Acqn. Time(s): 241
Acquired On :08/01/28 10:33:57 C/N :On

Figure 5 (Table 3)

Shows peak values for the C 1s and O 1s lines for non-treated paper, AKD and treated paper. ("FWHM" Full width at half maximum and "AC" Atom Concentration)

| Line | Paper | | | AKD | | | Treated paper | | | |
|---|---|---|---|---|---|---|---|---|---|---|
| | BE, eV | FWHM, eV | AC, at.% | BE, eV | FWHM, eV | AC, at.% | BE, eV | FWHM, eV | AC, at.% | |
| C 1s | 285,0 | 1,1 | 22,12 | 285,0 | 1,1 | 83,65 | 285,0 | 1 | 80,95 | C-(C,H) |
| | | | | | | | 285,9 | 0,95 | 7,6 | Unidentified atoms |
| | 286,8 | 1,25 | 39,37 | 286,1 | 1,2 | 8,59 | 286,7 | 0,95 | 2,33 | C-OH |
| | 288,3 | 1,05 | 6,55 | 287,6 | 1,75 | 2,01 | 287,7 | 1 | 1,75 | O-C-O, C=O |
| | 289,4 | 1,15 | 1,11 | 289,2 | 1,1 | 1,79 | 289,1 | 1,2 | 2,27 | COOH |
| O 1s | 531,2 | 1,2 | 0,88 | 532,8 | 1,75 | 2,64 | 532,3 | 1,7 | 3,79 | C=O |
| | 533,2 | 1,5 | 29,51 | 533,9 | 1,65 | 1,33 | 533,9 | 1,45 | 1,31 | C-OH |
| | 535,5 | 1,35 | 0,45 | | | | | | | Unidentified atoms |

METHOD TO PREPARE SUPERHYDROPHOBIC SURFACES ON SOLID BODIES BY RAPID EXPANSION SOLUTIONS

CROSS REFERENCE TO RELATED APPLICATIONS

This is a U.S. National Phase patent application of PCT/SE2008/050801, filed Jun. 30, 2008, which claims priority to U.S. provisional patent application Ser. No. 60/937,796, filed Jun. 29, 2007, and U.S. provisional patent application Ser. No. 61/022,563, filed Jan. 22, 2008, all of which are hereby incorporated by reference in the present disclosure in their entirety.

TECHNICAL FIELD

The present invention relates to the field of superhydrophobic surfaces and provides a method for producing such surfaces on a wide range of materials. Further, the invention refers to an arrangement for preparing a superhydrophobic surface on a substrate, a superhydrophobic film prepared by the method of the invention, and a substrate having deposited thereon the superhydrophobic film.

TECHNICAL BACKGROUND

In certain technological processes and fabrication procedures, as well as in many every-day situations, it is of crucial importance to utilize objects with strongly water-repellent surfaces that are stable enough to retain the water-repellent property even after water exposure. Various substrate surfaces which are smooth and planar at the molecular level, like mica and glass surfaces, can be rendered hydrophobic by means of well-established methods, such as deposition of a monolayer of lipid molecules or fluorocarbons with polar end groups, or, by means of some specific chemical reaction like treatment with alkylthiol of a thin gold layer that in a prior step has been deposited on the substrate surface. In this way, the contact angle for a droplet of water residing on a smooth substrate surface can be raised to a maximum of about 100-120 degrees.

Early on it was found, however, that one can realize even higher contact angle values, in fact approaching the theoretical maximum of 180 degrees, by employing substrate surfaces that are structured geometrically on a colloidal length scale, i.e. about $10^{-8}$-$10^{-5}$ m. In other words, in this context it is advantageous if the resulting hydrophobic surface possesses an unevenness that magnifies the contact surface between water and the hydrophobic surface to a significant extent. Evidently, this means that the actual contact surface with water is much larger than the projected, macroscopic surface, implying that it becomes thermodynamically unfavourable with complete (homogeneous) wetting in spite of the fact that an interface between water and hydrocarbon per se is characterized by a relatively low free surface energy, about 50 mJ per square meter. As a consequence, a number of thin air pockets exist between the water phase and the hydrophobic surface (heterogeneous wetting). In this situation, an approximately planar water-air interface with a surface tension of about 72 mJ per square meter rests attached to high peaks in the "mountain landscape" representing the hydrophobic surface while the valleys are filled with air (FIG. 1), cf. papers published by Cassie and Baxter (1) and Wenzel (2).

Solid surfaces of the kind discussed that exhibit a contact angle toward pure water in the range between about 150 and 180 degrees are commonly denoted as superhydrophobic surfaces. A well-known example taken from nature itself is the leaf of the lotus plant (*Nelumbo nucifera*). It is striking how easily a water droplet can move by rolling on a super-hydrophobic surface as soon as there is the slightest deviation from the horizontal plane. The reason for this behaviour is the comparatively weak total adhesion force that binds the droplet to the surface as only completely wetted portions of the solid surface contribute. The similarity in behaviour with a small mercury droplet is obvious though in the latter case the adhesion force becomes small mainly as a result of the high surface tension of the mercury droplet hindering substantial deviations from spherical shape. Furthermore, a superhydrophobic surface is, as a rule, "self-cleaning" which means that particles of dust and dirt which at first adhere to the surface are being transferred to water droplets sprinkled onto the surface and then removed when the droplets roll off the surface.

Onda and coworkers (3) have devised a method for rendering glass and metal surfaces superhydrophobic that is based upon smearing a molten wax (alkylketendimer, AKD) on the substrate surfaces followed by crystallization. Furthermore, a Japanese group of researchers have submitted a patent application based upon forming a superhydrophobic AKD-film on Pt/Pd surfaces and thereby transferring the fractal structure to the Pt/Pb film (4).

Despite previous efforts, there is still a need in the art for improving control and scaling up the application of strongly water-repellent materials and surfaces, in order to facilitate production as well as limiting the material use.

Hence, it is the object of the invention to meet these demands.

SUMMARY OF THE INVENTION

In a first aspect, the invention refers to a method for preparing a superhydrophobic surface on a solid substrate comprising the steps of:

(a) providing a solvent in the form of a pressurized fluid in a vessel, wherein the fluid exhibits a decrease in solvency power with decreasing pressure;

(b) adding a hydrophobic substance to the solvent as a solute, which substance is soluble with the pressurized fluid and has the ability to crystallize/precipitate after expansion of the fluid, thereby obtaining a solution of the solvent and the solute in the vessel;

(c) having at least one orifice opened on the vessel, thereby causing the pressurized solution to flow out of the vessel and depressurize in ambient air or in an expansion chamber having a lower pressure than within the vessel, the solute thereby forming particles;

(d) depositing the particles on the substrate in order to obtain a superhydrophobic surface.

Hereby, a pressurized fluid which expands rapidly as a result of depressurization is used to prepare the superhydrophobic surface, thereby facilitating the preparation of the surface.

Preferably, the solvent is a supercritical fluid, such as $CO_2$, $N_2$, Ar, Xe, $C_3H_8$, $NH_3$, $N_2O$, $C_4H_{10}$, $SF_6$, $CCl_2F_2$, or $CHF_3$, preferably $CO_2$.

In one embodiment the fluid exhibits a solvency power that decreases at least 10 times from a supercritical phase to a fluid/gas phase.

In one embodiment, the pressure of the fluid in the vessel is in the interval from 50-500 Bar, preferably 150-300 Bar.

In case the solvent is a supercritical fluid, the pressure and temperature of the fluid in the vessel are preferably above the critical value for the fluid, in order to allow a rapid expansion of the fluid when the pressure is lowered.

Preferably, the hydrophobic solute exhibits an intrinsic contact angle towards water above 90°, and is chosen from waxes, such as AKD, substances containing long saturated hydrocarbon chains, such as stearine, stearic acid, bees wax, or plastic substances, such as polyethylene and fluorinated polymers. Any other hydrophobic solute which is suitable for use in the present invention may also be used.

Further, the solution is preferably near the saturation level of the solvent/solute combination in order to reduce the consumption of supercritical solvent, thereby making the process more effective and less costly.

The temperature of the solution can be in the interval from 30 to 150° C., preferably from 40 to 80° C., depending on the specific components of the solution, i.e. the combination of solvent, solute and any other added ingredients. Most preferably, the temperature is above the melting point of the solute.

In one embodiment, more than one orifice is opened on the vessel, in order to allow a flexible preparation of the superhydrophobic surface.

Further, the orifice(s) is/are suitably designed so that an appropriate surface is covered upon deposition. For example, the orifice(s) may comprise a nozzle having a circular shape or the like.

The distance from the orifice to the substrate can be in the interval from 0.5 to 100 cm, 1 to 60 cm, preferably 1 to 6 cm (10 to 60 mm) depending on ambient conditions and desired properties of the superhydrophobic surface.

Moreover, the pressure of the expansion chamber is typically below the vaporization limit for the solvent and above vacuum, in order to allow for a rapid expansion of the solvent when entering the expansion chamber. The chosen pressure of the expansion chamber is also chosen with regard to desired properties of the superhydrophobic surface. In one embodiment, the level of pressure of the expansion chamber is at ambient pressure.

In still another embodiment, the particles that are formed are substantially in the size range of 10 nm to 100 μm.

In yet another embodiment, the solute is added continuously to the solvent, thereby making it possible to prepare e.g. a large hydrophobic surface.

Also, the substrate can be moved or rolled during deposition, in order to facilitate the preparation and/or to make the preparation economical with regard to use of solute material.

In a second aspect, the invention refers to an arrangement for preparing a superhydrophobic surface on a substrate, comprising a pressurizable vessel, which should withstand at least 500 Bar and an expansion chamber, the vessel being arranged to contain a solution of a solvent, such as a supercritical fluid, and a solute, in the form of a crystallizing or precipitable substance, the vessel further containing at least one orifice, adapted for directing an outflow of a pressurized solution into the expansion chamber, the expansion chamber being arranged to allow the solution to depressurize (or vaporize) in order for the crystallizing or precipitable substance to form particles, which particles are deposited on a substrate that is mounted on a sample holder.

In one embodiment, the expansion chamber is arranged so that the solvent is recycled to the pressurizable vessel. Hereby, the use of solvent can be limited, for economical and environmental concerns.

The expansion chamber may comprise at least one valve for release of gas and/or solvent.

In another embodiment, the vessel is arranged to allow continuous addition of the solute to the solution. Hereby, an arrangement is provided that is suitable for e.g. preparation of large surfaces.

In yet another embodiment, the substrate holder is adapted for being moved or rolled during deposition on the substrate, in order to facilitate the preparation and/or to make the preparation economical with regard to use of solute material.

In a third aspect, the invention refers to a superhydrophobic film, prepared by the method of the invention.

In one embodiment, the superhydrophobic film has a surface density of less than 10 g/m$^2$, preferably about 1 g/m$^2$. Hereby, by limiting the amount of used solute material, environmental and economical concerns are met. The film thickness is in the order of 10 micrometer.

In a fourth aspect, the invention refers to a substrate having deposited thereon a superhydrophobic film according to the invention.

For example, the substrate is chosen from paper, plastics, glass, metal, wood, cellulose, silica, carbon tape, textile and paint.

BRIEF DESCRIPTION OF THE DRAWINGS

FIG. 5 (table 3) shows peak values for the C 1s and O 1s lines for non-treated paper, AKD and treated paper. ("FWHM" Full width at half maximum and "AC" Atom Concentration)

DEFINITIONS

Figure 1:
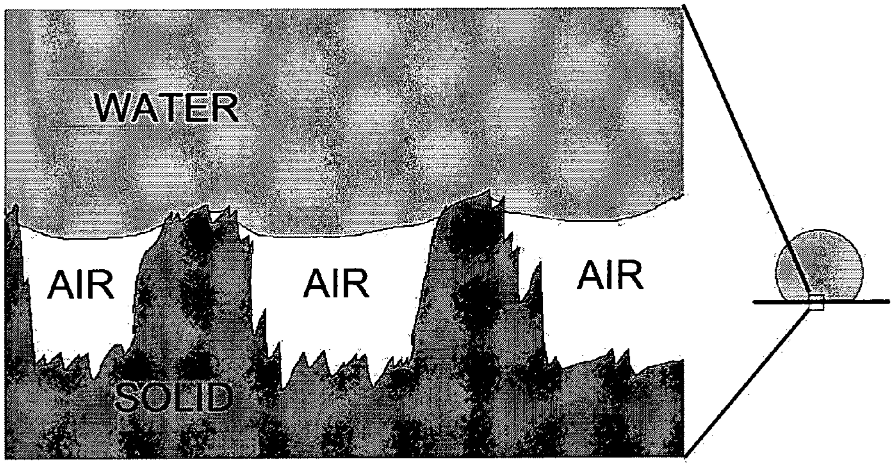
FIG. 1 discloses an approximately planar water-air interface with a surface tension of about 72 mJ per square meter that rests attached to high peaks in the "mountain landscape" representing the hydrophobic surface while the valleys are filled with air.

By "RESS" is meant rapid expansion of supercritical solvents.

A "superhydrophobic surface" refers to a surface exhibiting an apparent contact angle above 150° towards water measured according to the sessile drop method; as known by a person skilled in the art. Furthermore, a "superhydrophobic surface" has a sliding angle below 5° measured against the horizontal, for water droplets with a volume of 5 μl and larger (corresponding to a diameter of approximately 2 mm and greater for a spherical droplet)

A "sliding angle" refers to the angle which a solid has to be tilted in order for a droplet of a given liquid and of given size deposited on the surface to start sliding or rolling.

A "pressurized fluid" refers to a solvent that is exposed to a pressure, thereby being present in liquid form.

"Solvency power" is defined as the capacity to solve different solutes in a solvent. The solvency power varies also due to the pressure of the solvent. By decreasing the pressure, such as in this application, i.e. when a pressurized solvent/solute is let out through an orifice in an expansion chamber, the solvency power will drop. Supercritical fluids have an unexpectedly high solvency power and when the solvent goes from a supercritical stage to a fluid/gas stage the fluid/gas has a lower solvency power. The solvency power is typically at least 10 times higher in the supercritical than in the fluid/gas phase, and can be at least 100 times or even 1000 times higher in the supercritical than in the fluid/gas phase.

By "being soluble with the pressurized fluid" is meant that the solute shows a solubility in the order of at least 0.1 weight %, but preferably higher, in the order of 10 weight %.

By "the critical value of the fluid" is in the context of a supercritical fluid meant the limit above which temperature and pressure the critical fluid is in supercritical form. When the pressure and/or temperature are lowered so that the critical fluid is below the critical limit, the critical fluid will shift to a liquid or gaseous form.

By having the ability "to crystallize or precipitate after expansion of the fluid" is meant that the solute will form solid particles upon depressurization/expansion, which particles suitably are deposited on a surface.

By "vessel" is meant any kind of vessel or container which allows pressurization of the content, preferably at the level of up to at least 500 Bar, and which comprises at least one orifice allowing the content to be let out.

By an "orifice" is meant an opening in the vessel, such as a nozzle or the like, allowing the pressurized contents of the vessel to be let out in a controllable way to the surrounding environment.

By "vaporizing the solution" and "vaporize" is meant that the solvent expands so that the solvency power of the solvent decreases which causes the solute to crystallize or precipitate and form particles.

By "depressurizing" is meant when the pressure in a chamber is reduced.

By an "expansion chamber" is meant a chamber or environment outside the vessel, where the solvent is allowed to expand, and the solute therefore is allowed to crystallize. Optionally, the temperature and/or the pressure can be controlled in the expansion chamber to further control the expansion, crystallization and subsequent deposition of particles.

By a "crystallizing substance" is meant a substance which upon rapid expansion of the solvent in which it is solved has the capacity to crystallize/precipitate and form particles.

By a "sample holder" is meant an arrangement with which the substrate to be covered with the crystallized particles is held in a controllable way.

DETAILED DESCRIPTION OF THE INVENTION

Thus, the present invention relates to a method to prepare, preferably in just one single step of treatment, superhydrophobic surfaces on substrates of commercial importance, which are made from glass, plastic, paper, wood, metal, etc. According to a presently preferred scheme of the invention, one starts by preparing a solution for treatment comprising a pressurized fluid that show a big decrease in solvency power with decreasing pressure, such as supercritical fluids, and in particular supercritical carbon dioxide.

As hydrophobic solute a suitable crystallizing substance, i.e. any solid substance that (i) gives an intrinsic contact angle towards water above 90°; (ii) is soluble in the chosen pressurized fluid; and (iii) crystallizes/self organizes into particles, e.g. shaped like flakes, rods or other morphology after rapid expansion of the fluid, is used. This substance will hereafter in this document be denoted suitable crystallizing substance (SCS). An important subgroup is waxes like AKD, and other substances containing long saturated hydrocarbon chains such as stearin, stearic acid and beeswax.

Important requirements of the pressurized fluid are that the SCS should be soluble in the fluid under pressurized conditions and that the fluid should vaporize during depressurization (i.e. "rapid expansion"), thereby causing particle formation of the SCS. If a supercritical fluid is used as pressurized fluid, the temperature and the pressure must then exceed the critical values for this solvent. For carbon dioxide these values are 31.1° C. and 73.8 atmospheres. By varying the temperature and the pressure within the supercritical range, the solvent properties (e.g. the density) of the fluid can be varied within wide limits. For practical reasons, however, it is usually preferable to work with solutions near the saturation levels for the selected pressurized fluid/SCS combination. A review on the subject of nanomaterial and supercritical fluids is found in reference (5). See also table 1 below for critical temperature and pressure for some typical supercritical fluids.

TABLE 1

| Fluid | $T_c$ (° C.) | $P_c$ (atm) |
|---|---|---|
| $N_2$ | −147 | 33 |
| Ar | −122 | 48 |
| Xe | 17 | 58 |
| $CO_2$ | 31 | 73 |
| $C_3H_8$ | 97 | 42 |
| $NH_3$ | 133 | 113 |

At the following treatment step, when the SCS has been dissolved in the pressurized fluid, a small orifice is opened on the pressurized vessel containing the pressurized fluid/SCS mixture, which makes the fluid with dissolved SCS flow rapidly through one or more nozzles into the open air or into an expansion chamber of low pressure, whereby the fluid immediately vaporizes and small particles, e.g. flakes, or differently shaped micro-particles of the SCS are formed, preferably in the size range 10 nm to 100 μm and typically of the dimensions 5×5×0.1 micrometer, although other dimensions work as well. With high velocity these particles hit the substrate surface to be treated, which can be fixed or moving, and a relatively large SCS-substrate contact surface is formed. The adhesion obtained by means of van der Waals forces and other occurring surface forces to the substrate is usually sufficient to guarantee the sticking of the particles at practical usage. For some kinds of substrate to be treated, however, the strength of the adhesion may have to be tested by making simple peeling-off experiments with sticky tape. In the case the adhesion is deemed too poor, one might need to apply suitable surface modification steps, e.g. by increasing the roughness of the surface and/or applying an intermediate surface layer with improved binding to the surface.

The high velocity of the SCS is created due to the difference between the pressurized solvent/solute and the pressure in the expansion chamber, which can be 1 Bar, but larger differences is preferred such as 5, 10, 20, 40, 60, 80, 100, 150, 200, 250, 300, 400, or as much as 500 Bar.

According to a further embodiment of the invention an alternative to the spraying process of batch type described above is provided, as a continuous process in which the SCS is continuously dissolved in the pressurized fluid and sprayed onto the substrate. For instance, SCS can be melted and fed by a pump into the centre of a continuous countercurrent extraction column, in which the flow of pressurized fluid goes from bottom to top. From the top of the column the SCS/pressurized fluid mixture can be rapidly expanded through one or more nozzles as described for the batch process above. Furthermore, the substrate can be continuously moved/rolled as is common for instance in paper manufacture industry. In this as in other embodiments of the invention the nozzle size and the opening can be varied within wide ranges, as easily determined by a person skilled in the art.

As a result of our investigations we have established that although the flow rate through the nozzle is very high, some aggregation takes place of the micro-particles primarily formed in the air/expansion chamber before the wax film is finally stabilized on the substrate.

The particle size distribution was obtained according to the following procedure: Firstly, 200 randomly selected, well-separated particles from the SEM image were measured in zoom-in mode. Secondly, the particle size was calculated based on the ratio of their diameters to the SEM magnification scale in Matlab; and finally, a particle size distribution histogram was drawn and the mean particle size diameter. Different average sizes of the adhering wax particles can be generated by varying the temperature from close to the melting point of the SCS (around 50° C.) to about 100° C., the pressure within the range of 100 to 500 atmospheres [Bar] and the concentration of wax in the pressurized fluid (here: supercritical carbon dioxide) as well as the geometry of the nozzle, and last but not least, by varying the distance between the exit orifice of the nozzle and the substrate surface (ca 1-25 cm). The average particle sizes of collected wax particles were slightly decreased with higher pre-expansion pressure and temperature as well as with smaller spraying distance.

One significant feature of the invention is that if two or more nozzles or groups of nozzles are placed on different distances from the substrate surface, different average particle sizes can be obtained—preferably a few relatively large aggregates aimed to become "mountain peaks", and, in addition, a number of relatively small particles which aim to magnify the actual hydrophobic surface area per square meter enough to make the superhydrophobic surface "robust" in different applications.

Figure 2:
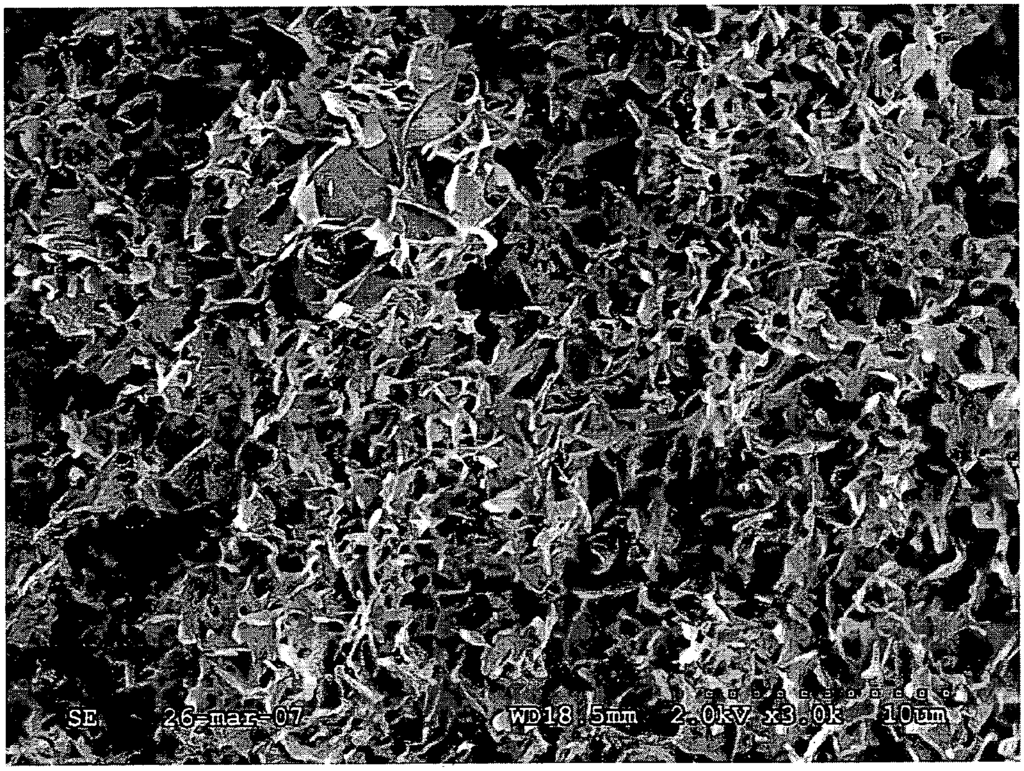
FIG. 2 discloses a typical film made with the method of the invention consisting of aggregated flake-like microparticles.

In addition, in separate experiments, the inventors have shown that in order to generate superhydrophobic properties of a wax film it is, as a rule, sufficient to attain a film thickness in the order of 10 micrometer, which due to its porosity is corresponding to approximately 1 g of wax per square meter. For the sake of comparison, in order to manufacture ordinary waxed paper (water-repellent though, but definitely not superhydrophobic) with a typical surface density of 100 g per square meter, about 10 g wax per square meter is needed. Thus, the method according to the present invention involves a much more efficient use of the waxy component. In FIG. 2 an electron-microscopic picture is shown of a typical film structure obtained by means of the method described. Aggregated small wax flakes are loosely packed, thus giving rise to a large surface area. This appearance depends only to a minor extent on the kind of wax used.

Superhydrophobic wax surfaces consisting of wax flakes were successfully produced by this invention, giving average contact angles to water of above 150 degrees for all the different conditions tested in the experiments. The method shows high reproducibility as more than 80 experiments were performed, all giving surfaces with contact angles above 150 degrees.

It is shown by the examples below that substrate surfaces of widely different chemical nature can be rendered superhydrophobic by means of the invention, paper, spin-coated nano-smooth cellulose surfaces, silica and carbon tape. The method is usable for rough and smooth, organic and inorganic surfaces, such as glass, porcelain, plastic, paper of different qualities, textiles, wood and materials made from wood such as chipboard, metals and painted or lacquered surfaces.

Furthermore, it is recognized that waxes of biological origin as well as synthetic waxes or mineral waxes can be used. Moreover, it is evident that for each combination of SCS and substrate it is advisable to investigate that the adhesion of the wax film is sufficiently strong by making peel tests and through exposure to water and some solvents and making simple roll-off observations.

The geometry of the objects to be treated to produce superhydrophobic surfaces will in the end determine the arrangement of the set-up of nozzles and the design of the pressure vessel containing the solution.

In addition to the methods disclosed above the invention also relates to the materials prepared, i.e. substrates made from a wide range of materials as discussed above, having a superhydrophobic coating as obtained by these methods.

The invention will now be described by examples, which shall not be construed as limiting the scope of the invention, but merely exemplifying preferred embodiments.

EXAMPLES

Figure 3:
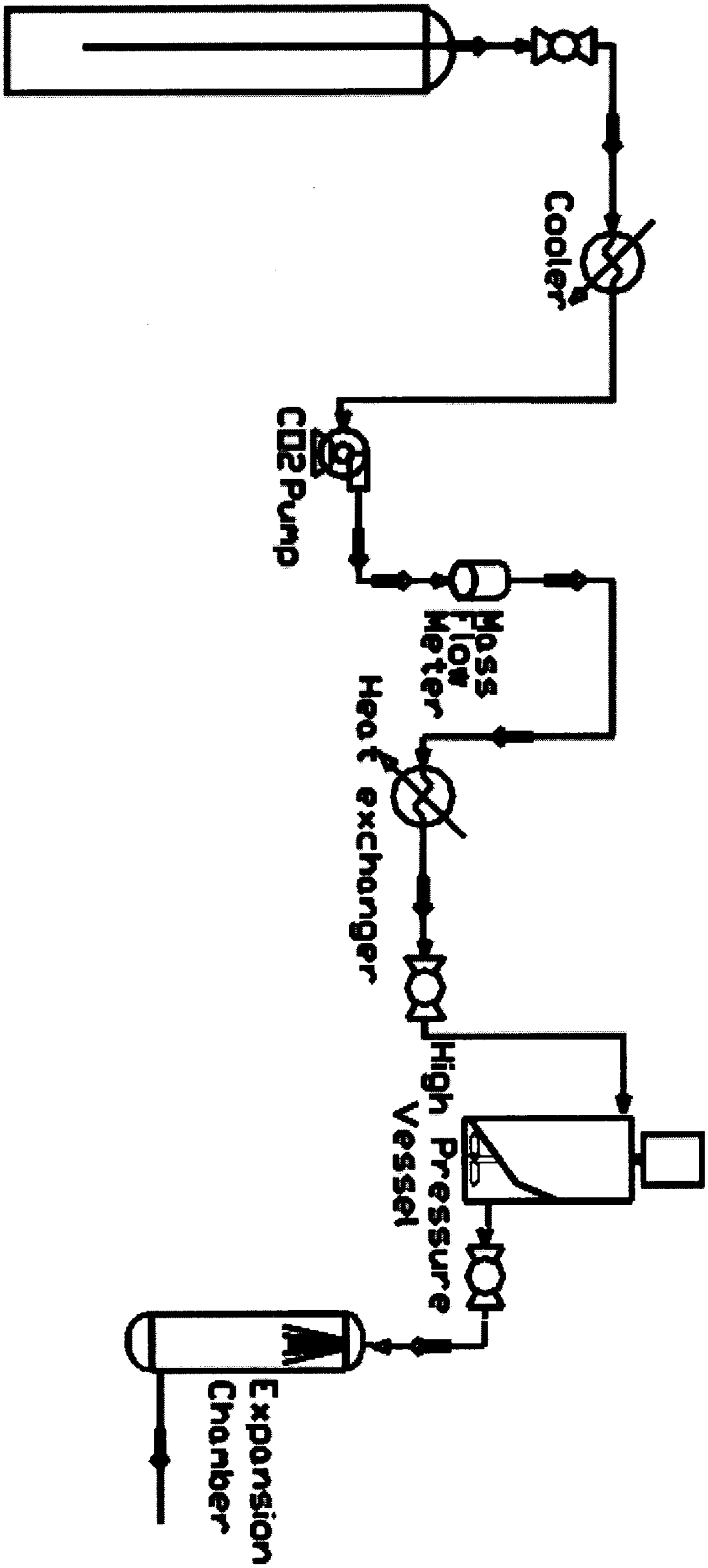
FIG. 3 discloses a schematic diagram of the Rapid Expansion of Supercritical Solution apparatus.
Figure 4A:
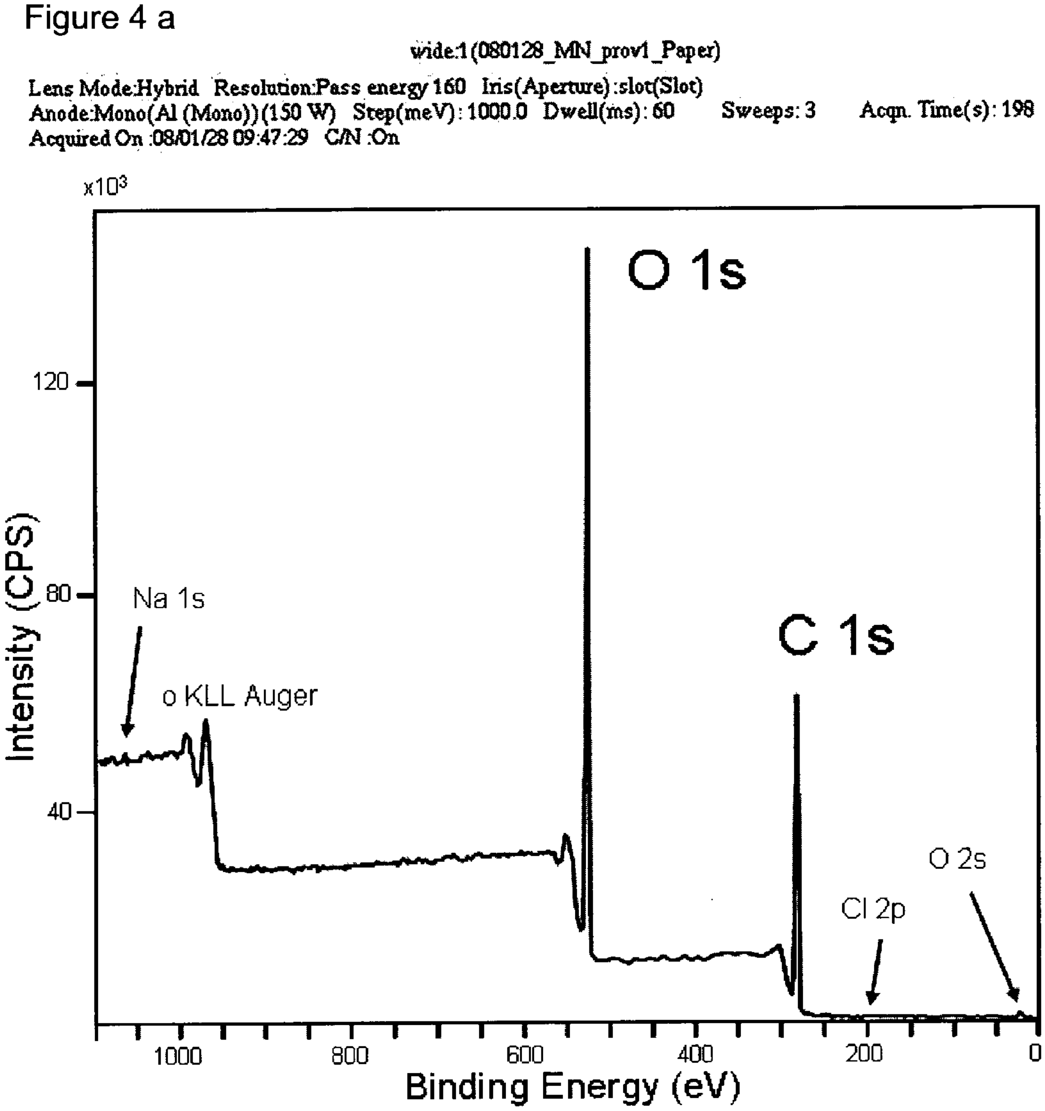
FIG. 4*a-i* shows XPS spectra taken of the used paper (4*a-c*), the used AKD (4*d-f*) and a RESS-sprayed surface (4*g-i*). This clearly indicates that the surface exposed in accordance with the invention is completely covered with AKD. The corresponding binding energy (BE) values for line C 1s and O 1s are found in Table 3 (FIG. 5).
Figure 4B:
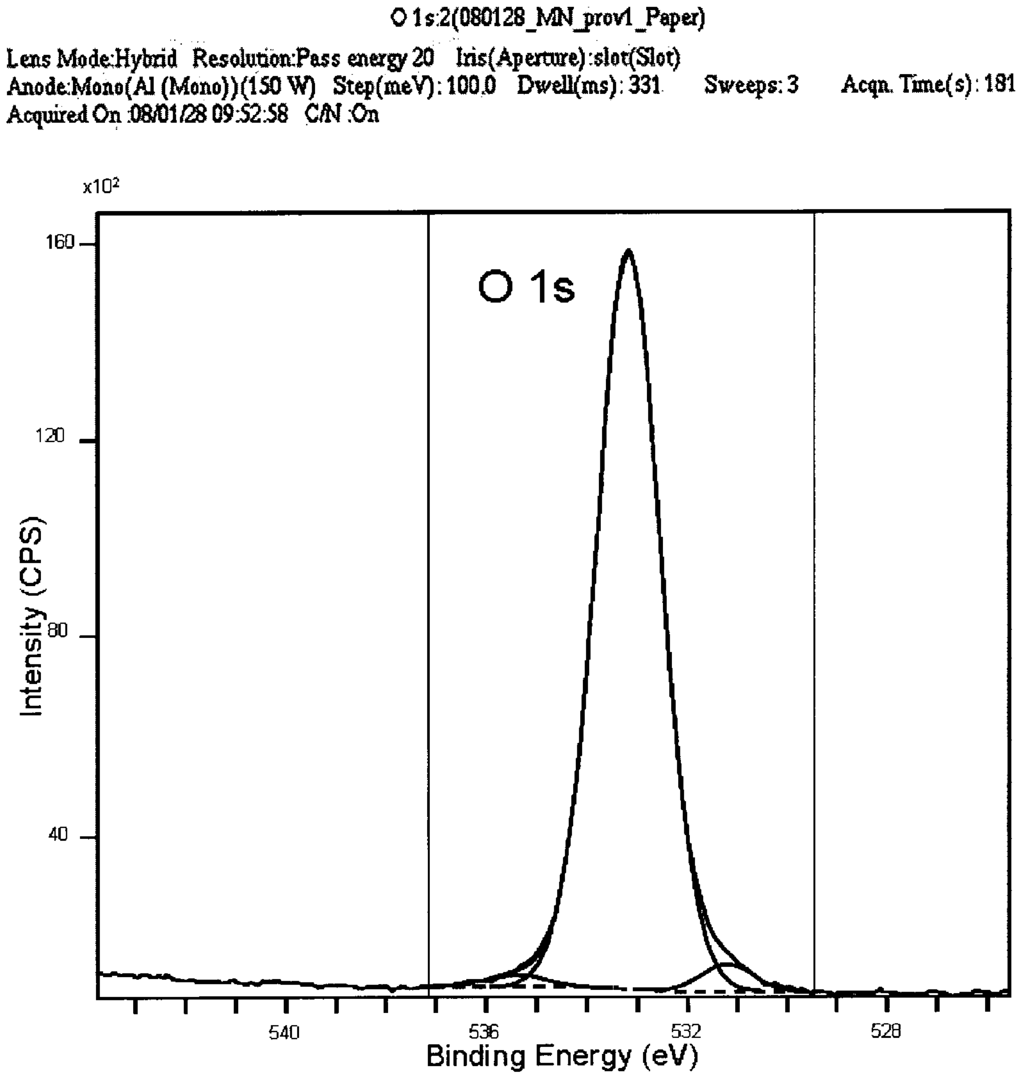
Figure 4C:
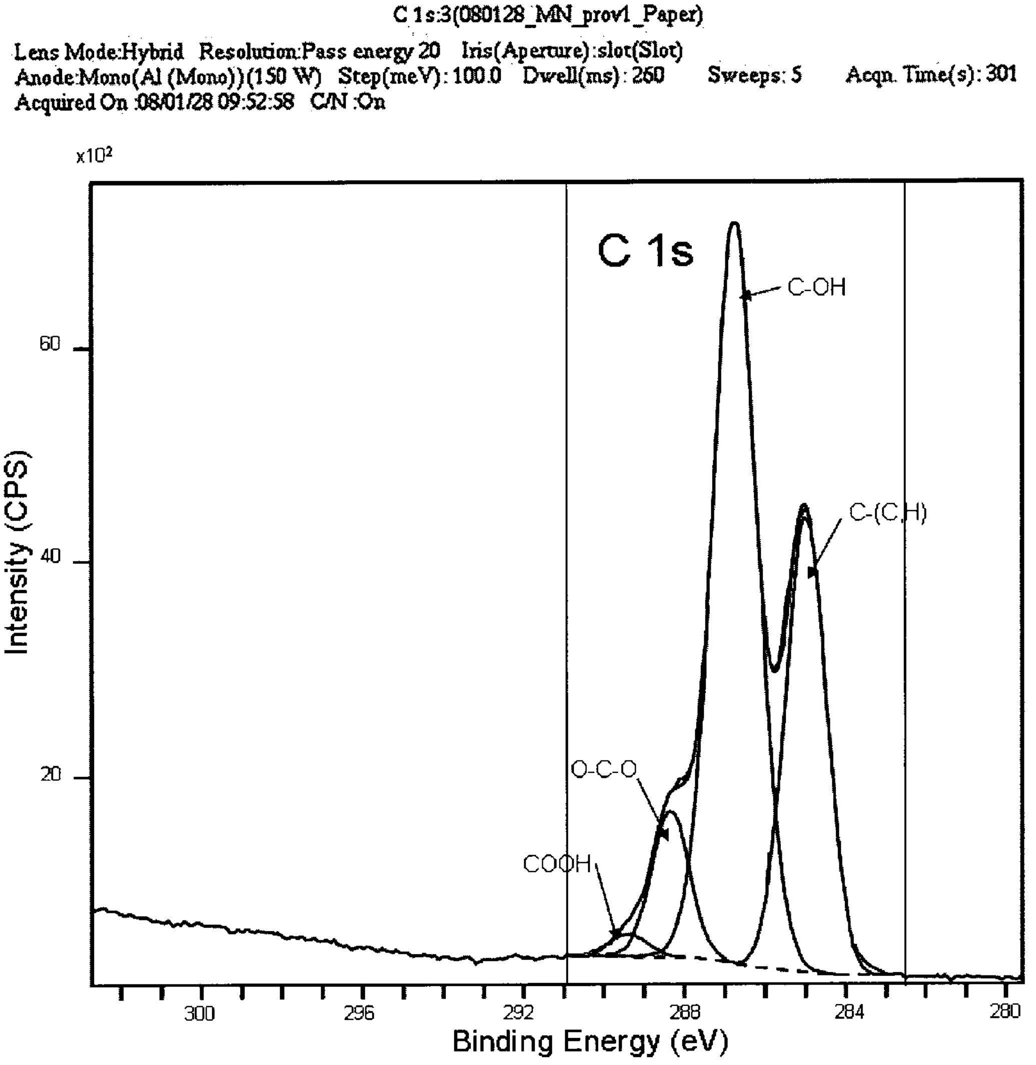
Figure 4D:
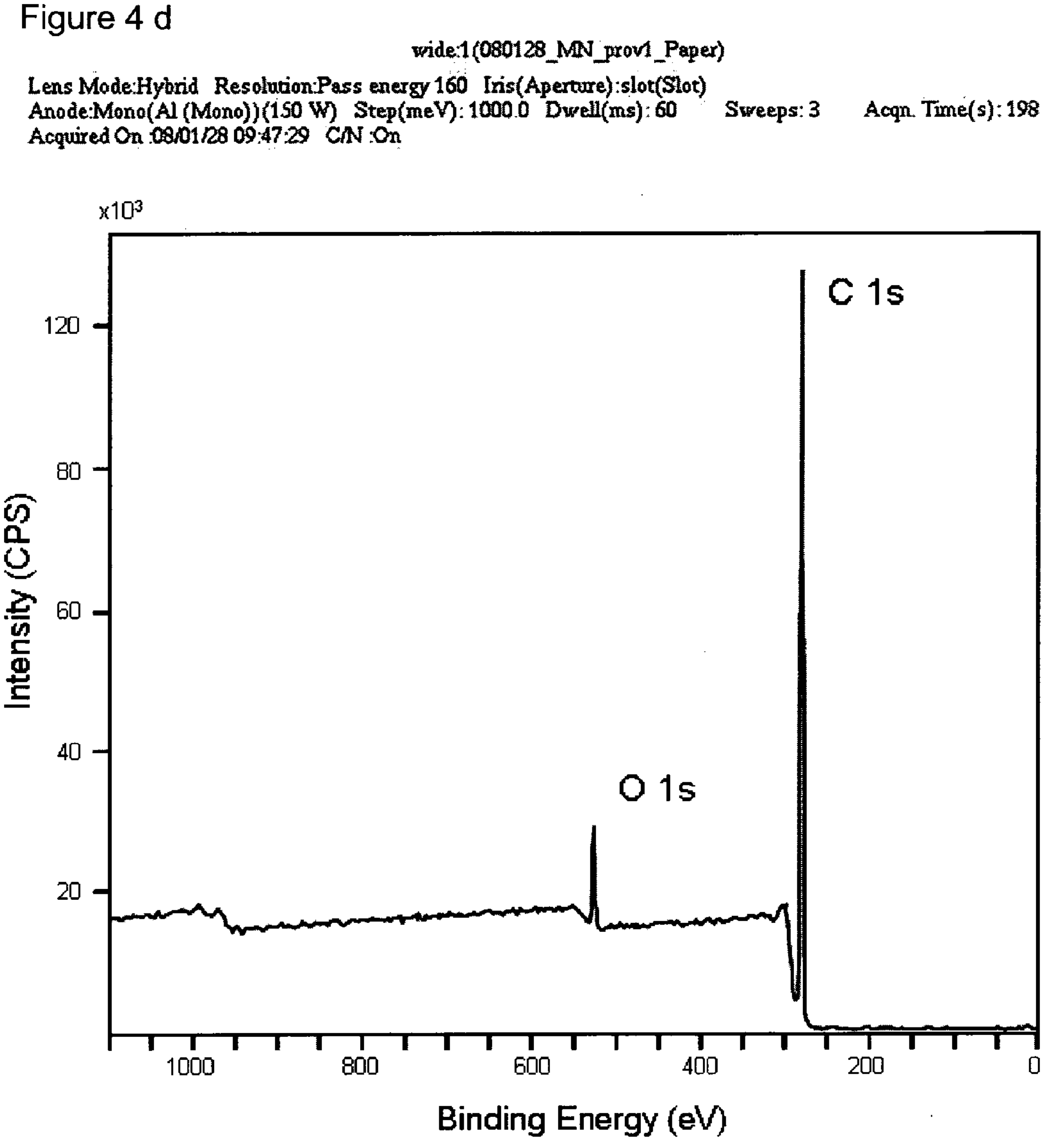
Figure 4E:
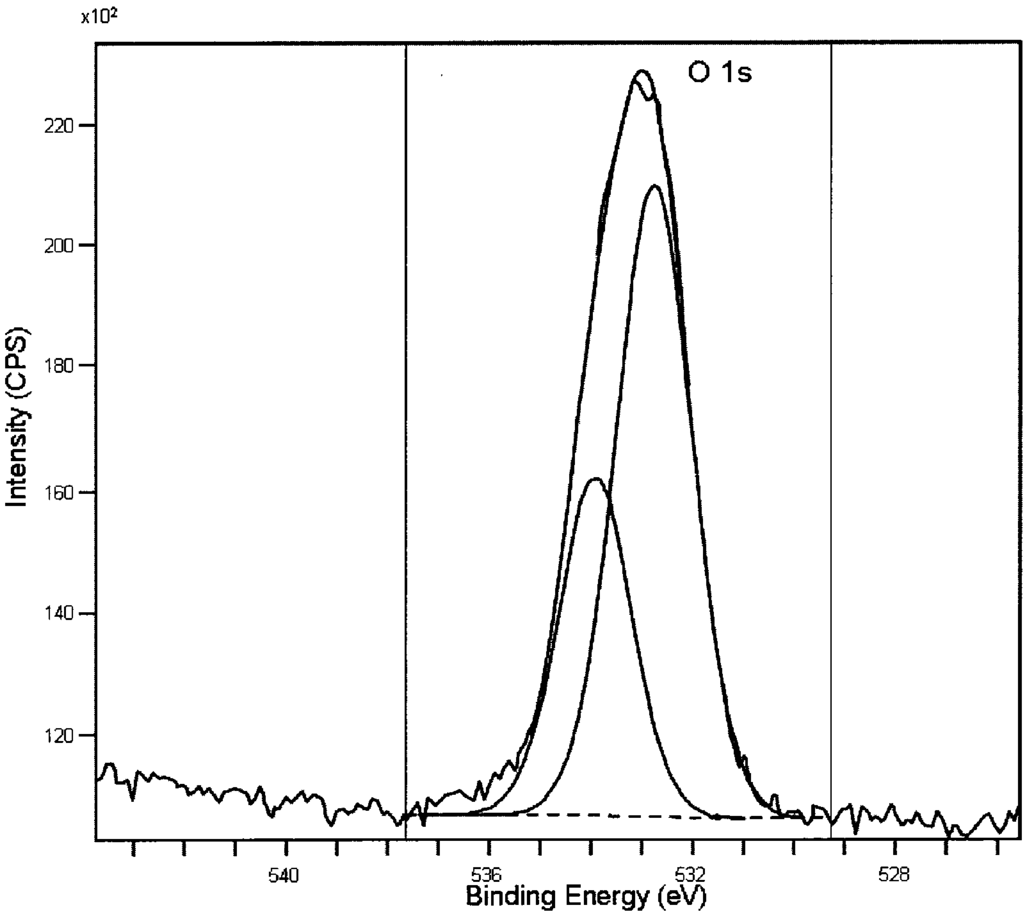
Figure 4F:
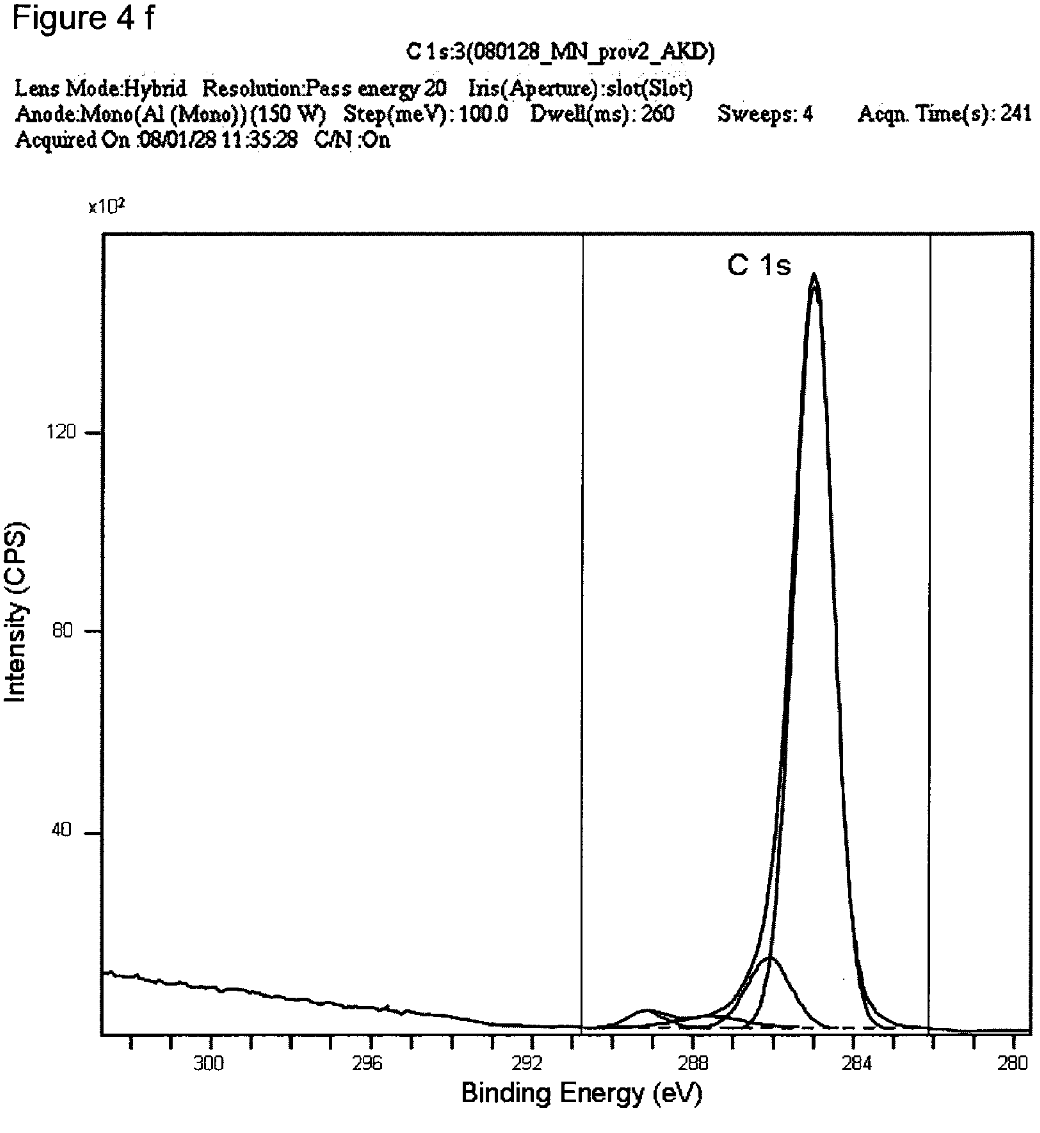
Figure 4G:
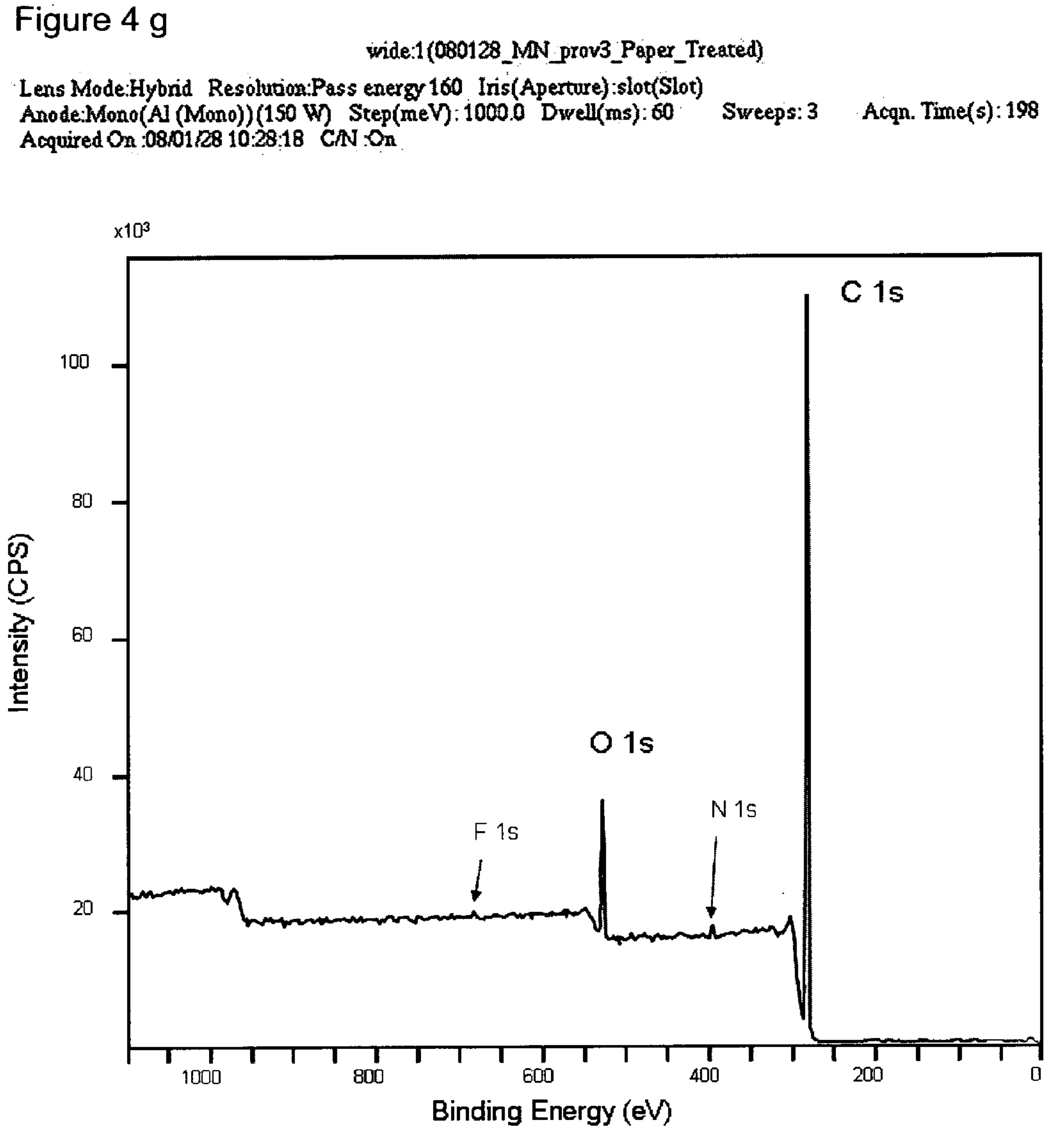
Figure 4H:
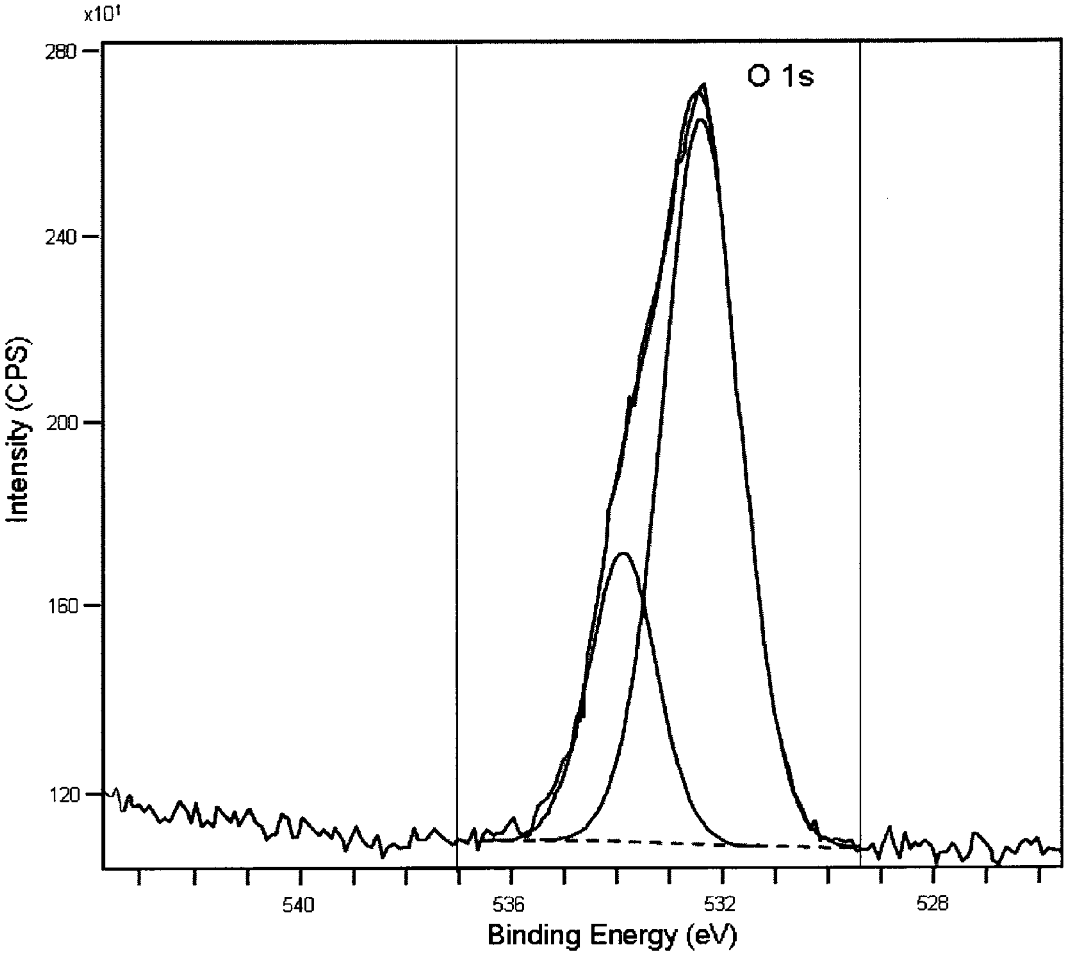
Figure 4I:
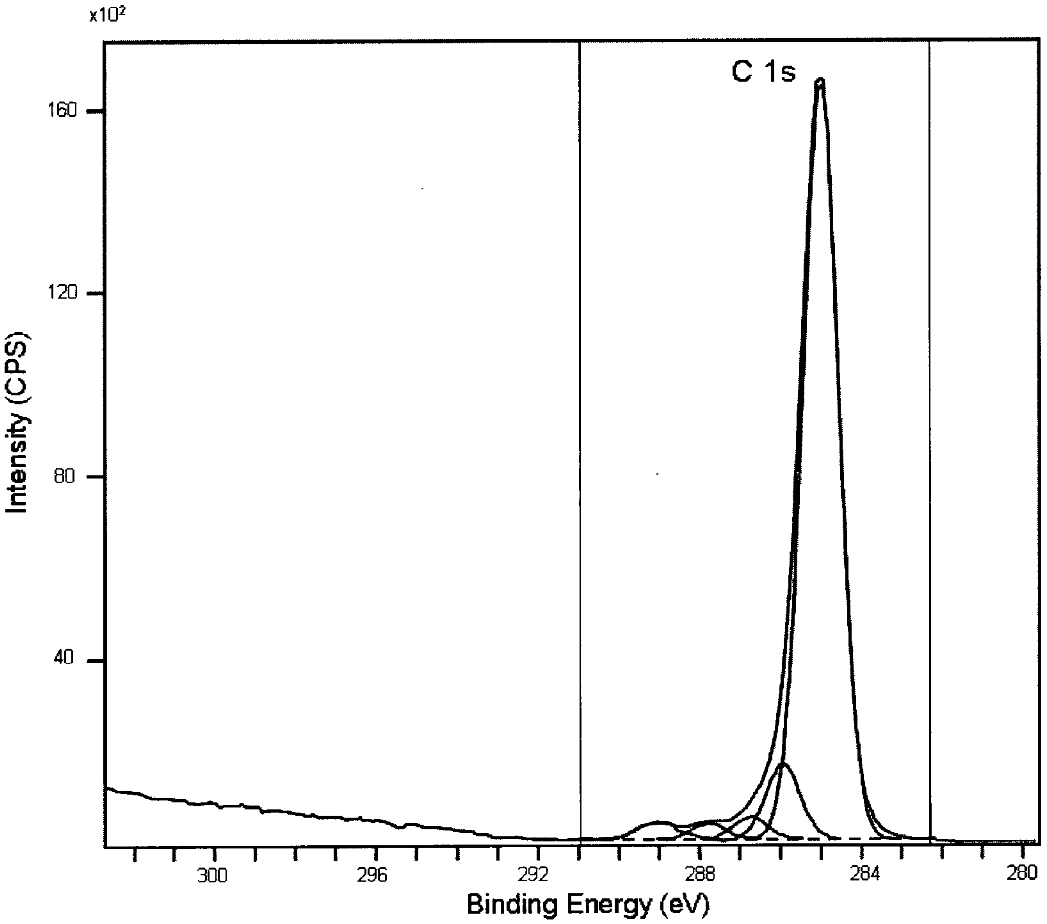

In all examples, a bench-scale commercial rapid expansion unit has been used (FIG. 3). All here reported examples are made with substances in the subgroup "waxy substances". Firstly, a certain amount of SCS is loaded into the high-pressure vessel. Liquid carbon dioxide from the cylinder is delivered through stainless steel tubing to the inlet of a high pressure fluid pump. Compressed liquid carbon dioxide is fed to the heat exchanger prior to entering the isolated and jacketed stainless steel high pressure vessel of 0.1 L volume. Carbon dioxide is pumped and heated to desired pressure and temperature. SCS is dissolved by magnetic stirring in the pressurized and heated vessel now containing supercritical carbon dioxide. After equilibrium saturation conditions are reached typically after one hour the pressure is dropped by opening a valve before the nozzle resulting in rapid expansion of the supercritical carbon dioxide containing SCS through the nozzle and into the expansion chamber in which SCS precipitates and the carbon dioxide vaporizes and escapes from the bottom of the chamber. The temperature inside the nozzle and the expansion chamber decrease when carbon dioxide is expanding, but can be adjusted by flushing with heated nitrogen. Spraying of SCS onto a substrate placed on a desired distance from the nozzle goes on for a certain time, typically 10 seconds. The substrates are either fixed or, for certain applications, wrapped around a cylinder of 4 cm in diameter (used in the present examples but the dimensions are not critical) that is rotating at 120 rpm (used in the present examples but the rate is not critical) during the spraying. Even though other possibilities certainly exists, the parameters varied in the following examples are a) selection of SCS; b) pressure; c) temperature; d) spraying time; e) type of substrate; d) spraying distance; and e) fixed or rotating sample holder.

Example 1

| SCS | AKD |
|---|---|
| Pressure | 300 Bar |
| Temperature | 65° C. |
| Spraying time | 12 seconds |
| Substrate | paper of kraft liner type |
| Spraying distance | 30 mm |
| Sample holder | 40-mm cylinder rotating at 120 rpm |

A 5 microlitre water droplet placed on the surface of untreated liner was completely absorbed after 20 seconds. After treatment with the herein described method a 5 microlitre water droplet showed a contact angle of 160° stable over time, which was confirmed by a control measurement after 60 seconds.

Example 2

| SCS | AKD |
|---|---|
| Pressure | 300 Bar |
| Temperature | 40° C. |
| Spraying time | 10 seconds |
| Substrate | paper roughed with emery cloth |
| Spraying distance | 10 mm |
| Sample holder | 40-mm diameter cylinder rotating at 120 rpm |

A 5 microlitre water droplet placed on the surface of paper roughed with emery cloth. After treatment with the herein described method a 5 microlitre water droplet showed a contact angle of 173° stable over time, which was confirmed by a control measurement after 60 seconds.

Example 3

| SCS | AKD |
|---|---|
| Pressure | 250 Bar |
| Temperature | 60° C. |
| Spraying time | 10 seconds |
| Substrate | Spincoated cellulose surface |
| Spraying distance | 45 mm |
| Sample holder | fixed |

A very smooth cellulose surface, prepared according to reference (6), was used in this example. Surfaces of this type are very thin and absorb a negligible amount of water, however, the a water droplet placed on the surface will quickly spread so that after 10 seconds it will have a contact angle of well below 10°. A treated surface on the contrary for a 5 microlitre water droplet had a contact angle of 159°, stable over time, and a sliding angle of 3° degrees.

Example 4

| SCS | AKD |
|---|---|
| Pressure | 300 Bar |
| Temperature | 60° C. |
| Spraying time | 10 seconds |
| Substrate | Scratched silicon wafer |
| Spraying distance | 60 mm |
| Sample holder | fixed |

The surface of a silicon wafer was scratched with a glass cutter to obtain a rough surface. Such a surface shows complete wetting because of the grooves, which work like capillaries. The treated surface showed a contact angle of 153° for a 5 microliter water droplet.

Example 5a)

| SCS | Stearic acid |
|---|---|
| Pressure | 300 Bar |
| Temperature | 60° C. |
| Spraying time | 10 seconds |
| Substrate | carbon tape |
| Spraying distance | 25 mm |
| Sample holder | fixed |

A carbon tape of the type used for scanning electron microscopy was used as substrate for this run. A carbon tape of this kind shows a contact angle to water of 98°, stable over time. The treated surface had a contact angle to water of 162°, also stable over time.

Example 5b)

| SCS | Stearin (tristearate) |
|---|---|
| Pressure | 200 Bar |
| Temperature | 80 |
| Spraying time | 10 seconds |
| Substrate | carbon tape |
| Spraying distance | 25 mm |
| Sample holder | fixed |

For untreated carbon tape see example 4a). A contact angle measurement using a 5 microlitre droplet showed a contact angle of 157°, as a mean value of 4 measurements.

Example 5c)

| SCS | AKD |
|---|---|
| Pressure | see Table 2 |
| Temperature | see Table 2 |
| Spraying time | 12 seconds |
| Substrate | carbon tape |
| Spraying distance | se table 2 |
| Sample holder | fixed |

TABLE 2

| Run order (#) | Temperature (° C.) | Pressure (Bar) | Distance (mm) | Contact angle (°) |
|---|---|---|---|---|
| 1 | 50 | 200 | 20 | 159 |
| 2 | 60 | 150 | 15 | 154 |
| 3 | 40 | 150 | 25 | 155 |
| 4 | 50 | 200 | 20 | 159 |
| 5 | 40 | 250 | 15 | 153 |
| 6 | 60 | 250 | 25 | 152 |

For untreated carbon tape see example 5a). In this example, temperature, sample distance and pressure were varied. The contact angles shown in the table are mean values of at least 4 measurements, and all were stable over time controlled with one measurement taken every second for 20 seconds.

Example 6

| SCS | AKD |
|---|---|
| Pressure | 300 Bar |
| Temperature | 65° C. |
| Substrate | Aluminium (Al) |
| Spraying distance | 15 cm |
| Sample holder | fixed |
| Contact angle | 161° |

Example 7

| SCS | AKD |
|---|---|
| Pressure | 300 Bar |
| Temperature | 65° C. |
| Substrate | Polyethylene |
| Spraying distance | 15 cm |
| Sample holder | fixed |
| Contact angle | 155° |

Example 8

| SCS | AKD |
|---|---|
| Pressure | 300 Bar |
| Temperature | 65° C. |
| Substrate | Stainless steel |
| Spraying distance | 15 cm |
| Sample holder | fixed |
| Contact angle | 167° |

Example 9

| SCS | AKD |
|---|---|
| Pressure | 300 Bar |
| Temperature | 65° C. |
| Substrate | Glass |
| Spraying distance | 15 cm |
| Sample holder | fixed |
| Contact angle | 155° |

Example 10

| SCS | AKD |
|---|---|
| Pressure | 200 Bar |
| Temperature | 65° C. |
| Substrate | wood |
| Spraying distance | 15 cm |
| Sample holder | fixed |
| Contact angle | 159° |

Example 11

| SCS | AKD |
|---|---|
| Pressure | 200 Bar |
| Temperature | 65° C. |
| Substrate | Commecial Gel Coat |
| Spraying distance | 15 cm |
| Sample holder | fixed |
| Contact angle | 156° |

TABLE 3

Shows peak values for the C 1s and O 1s lines for non-treated paper, AKD and treated paper. ("FWHM" Full width at half maximum and "AC" Atom Concentration)

| | Paper | | | AKD | | | Treated paper | | | |
|---|---|---|---|---|---|---|---|---|---|---|
| Line | BE, eV | FWHM, eV | AC, at. % | BE, eV | FWHM, eV | AC, at. % | BE, eV | FWHM, eV | AC, at. % | |
| C 1s | 285.0 | 1.1 | 22.12 | 285.0 | 1.1 | 83.65 | 285.0 | 1 | 80.95 | **C**—(C,H) |
| | | | | | | | 285.9 | 0.95 | 7.6 | Unidentified atoms |
| | 286.8 | 1.25 | 39.37 | 286.1 | 1.2 | 8.59 | 286.7 | 0.95 | 2.33 | **C**—OH |
| | 288.3 | 1.05 | 6.55 | 287.6 | 1.75 | 2.01 | 287.7 | 1 | 1.75 | O—**C**—O, **C**═O |
| | 289.4 | 1.15 | 1.11 | 289.2 | 1.1 | 1.79 | 289.1 | 1.2 | 2.27 | **C**OOH |
| O 1s | 531.2 | 1.2 | 0.88 | 532.8 | 1.75 | 2.64 | 532.3 | 1.7 | 3.79 | C═**O** |
| | 533.2 | 1.5 | 29.51 | 533.9 | 1.65 | 1.33 | 533.9 | 1.45 | 1.31 | C—**O**H |
| | 535.5 | 1.35 | 0.45 | | | | | | | Unidentified atoms |

REFERENCES (1) Cassie, A. B. D. and S. Baxter (1944), Trans Faraday Soc 40, 546-551

(2) Wenzel, R. N. (1936), Ind. Eng. Chem. 28, 988-994

(3) Onda, T., S. Shibuichi, N. Satoh and K. Tsujii (1996), Langmuir 12(9), 2125-2127.

(4) Tsujii K; Yan H
Japanese patent
AN 2006-515705 [53] AN 2006-515705 [53] WPINDEX
TI Surface fine grooving structure formation method e.g. for electric product involves forming thin layer consisting of different alloy from alkyl ketene dimer, on alkyl ketene dimer surface (5) Ye, XR, Wai, C M, Making nanomaterials in supercritical fluids: A review, J CHEM EDUC 80 (2): 198-204 FEB 2003

(6) Gunnars, S., L. Wågberg and M. A. Cohen Stuart (2002, Cellulose 9, 239-249.

The invention claimed is:

1. Method for preparing a superhydrophobic surface on a solid substrate comprising the steps of:

(a) providing a solvent in the form of a pressurized fluid in a vessel, wherein the fluid exhibits a decrease in solvency power with decreasing pressure;

(b) adding a hydrophobic substance to the solvent as a solute, which substance is soluble with the pressurized fluid and has the ability to crystallize after expansion of the fluid, thereby obtaining a solution of the solvent and the solute in the vessel;

(c) having at least one orifice opened on the vessel, thereby causing the pressurized solution to flow out of the vessel and vaporize in ambient air or in an expansion chamber having a lower pressure than within the vessel, the solute thereby forming particles;

(d) depositing the particles on the substrate in order to obtain a superhydrophobic surface, wherein the distance from the at least one orifice to the substrate is between 1 to 6 centimetres, and wherein the superhydrophobic surface is formed on the solid substrate.

2. Method according to claim 1, wherein the solvent is a supercritical fluid selected from the group consisting of $CO_2$, $N_2$, Ar, Xe, $C_3H_8$, $NH_3$, $C_4H_{10}$, $SF_6$, $CCl_2F_2$, and $CHF_3$.

3. Method according to claim 2, wherein the pressure and temperature of the fluid in the vessel are above the critical value for the fluid.

4. Method according to claim 1, wherein the fluid exhibits a solvency power that decreases at least 10 times from a supercritical phase to a fluid/gas phase.

5. Method according to claim 1, wherein the pressure of the fluid in the vessel is in the interval from 50-500 Bar.

6. Method according to claim 1, wherein the hydrophobic solute exhibits an intrinsic contact angle towards water above 90°, and is selected from the group consisting of waxes, AKD, substances containing long saturated hydrocarbon chains, stearin, stearic acid, bees wax, plastic substances, polyethylene, and fluorinated polymers.

7. Method according to claim 6, wherein the hydrophobic solute is a wax.

8. Method according to claim 7, wherein the hydrophobic solute is alkylketendimer (AKD).

9. Method according to claim 1, wherein the solution is near the saturation level of the solvent/solute combination.

10. Method according to claim 1, wherein the temperature of the solution is in the interval from 30 to 150 ° C.

11. Method according to claim 1, wherein more than one orifice is opened on the vessel.

12. Method according to claim 1, wherein the pressure of the expansion chamber is below the vaporization limit for the solvent and above vacuum.

13. Method according to claim 1, wherein the particles that are formed range in size from 10 nm to 100 μm.

14. Method according to claim 1, wherein the solute is added continuously to the solvent.

15. Method according to claim 1, wherein the substrate is moved or rolled during deposition.

* * * * *